United States Patent
Jarvis et al.

(10) Patent No.: US 8,420,282 B2
(45) Date of Patent: Apr. 16, 2013

(54) FILTERS

(75) Inventors: Anthony N Jarvis, Cheshire (GB); Martin Walker, Cheshire (GB)

(73) Assignee: Datalase Ltd, Cheshire (GB)

( * ) Notice: Subject to any disclaimer, the term of this patent is extended or adjusted under 35 U.S.C. 154(b) by 275 days.

(21) Appl. No.: 13/000,014

(22) PCT Filed: Jul. 2, 2009

(86) PCT No.: PCT/GB2009/050776
§ 371 (c)(1),
(2), (4) Date: Jan. 16, 2011

(87) PCT Pub. No.: WO2010/001172
PCT Pub. Date: Jan. 7, 2010

(65) Prior Publication Data
US 2011/0122347 A1 May 26, 2011

(30) Foreign Application Priority Data

Jul. 3, 2008 (GB) .................................. 0812213.7
Apr. 2, 2009 (GB) .................................. 0905785.2

(51) Int. Cl.
*G02B 5/20* (2006.01)
*G02F 1/1335* (2006.01)

(52) U.S. Cl.
USPC ............... 430/7; 430/332; 430/333; 430/346; 430/945; 349/106

(58) Field of Classification Search ....................... None
See application file for complete search history.

(56) References Cited

U.S. PATENT DOCUMENTS

| 4,734,355 A | 3/1988 | Lewis et al. | |
| 2001/0051305 A1* | 12/2001 | Lee .................................. | 430/7 |

FOREIGN PATENT DOCUMENTS

| EP | 0 444 703 | | 9/1991 |
| JP | 4-358124 A | * | 12/1992 |
| JP | 08 133996 | | 5/1996 |
| JP | 11 001445 | | 1/1999 |
| JP | 2008007773 | | 1/2008 |
| JP | 2008120860 | | 5/2008 |
| KR | 2007-0074471 A | * | 8/2004 |
| KR | 20070037775 | | 4/2007 |
| WO | WO 2006/018640 | | 2/2006 |
| WO | WO 2007/063332 | | 6/2007 |

OTHER PUBLICATIONS

English language abstract of KR 2007074471 A (Aug. 2004).*

* cited by examiner

*Primary Examiner* — John A. McPherson
(74) *Attorney, Agent, or Firm* — Saliwanchik, Lloyd & Eisenschenk

(57) ABSTRACT

A method for producing a color filter, comprising: applying to a substrate at least one diacetylene capable of undergoing a light-activated color change reaction, and exposing the substrate to light thereby causing the exposed regions of the substrate to change color. The invention also provides devices comprising colored filters such as liquid crystal displays.

18 Claims, No Drawings

FILTERS

CROSS REFERENCE TO A RELATED APPLICATION

This application is a National Stage Application of International Application Number PCT/GB2009/050776, filed Jul. 2, 2009; which claims priority to Great Britain Application No. 0812213.7, filed Jul. 3, 2008 and Great Britain Application No. 0905785.2, filed Apr. 2, 2009; all of which are incorporated herein by reference in their entirety.

FIELD OF THE INVENTION

This invention relates to coloured filters, methods for production and use thereof.

BACKGROUND OF THE INVENTION

Colour filters are widely used in photography and liquid crystal display devices. Generally the filters contain filter elements of three different colours, typically red, green and blue. Colour filters filter light by wavelength range, such that separate filtered intensities include information about the colour of light.

Numerous techniques have been employed to form colour filters, including the use of photoresists, deposition of organic pigments by vacuum evaporation followed by conventional photolithographic lift-off techniques, the use of dyed and patterned stretched film material to create an internal colour polarising filter, and the use of conventional silver halide photosensitive layers. Prior art techniques for forming colour filters are described for instance in U.S. Pat. No. 4,743,098 and U.S. Pat. No. 5,578,404. Some of these techniques are expensive and time consuming and there remains a desire to provide improved methods for forming colour filters.

SUMMARY OF THE INVENTION

In a first aspect of the invention, there is provided a method for producing a colour filter, comprising:
applying to a substrate at least one diacetylene capable of undergoing a light-activated colour change reaction, and
exposing the substrate to light thereby causing the exposed regions of the substrate to change colour.

In a second aspect of the invention, there is provided a device comprising a colour filter as described in the first aspect of the invention. Generally, the colour filter is obtainable by the method according to the first aspect of the invention.

DESCRIPTION OF THE INVENTION

The coloured filters of the present invention are produced by applying to a substrate at least one diacetylene capable of undergoing a colour change reaction on exposure to light, exposing the substrate to light thereby causing the exposed regions to change colour.

Colour Change

Any colour change is possible as a result of the reaction. However, the preferred colour change reaction is in the first instance one of colourless to coloured. However, the coloured regions can then undergo further colour changes on further light exposure to give colours different to the first colour obtained. The colours obtained can be opaque or transparent, depending upon the use of the coloured filters.

Light Source

The light used to initiate the colour change reaction can be laser or non-coherent light.

The laser used to initiate the light activated colour change reaction can be a ultra-violet, visible, near-infrared or mid to far infrared laser. It can be a fiber laser, a gaseous laser such as a $CO_2$ laser, a diode laser or a diode array laser. The laser can be a steered beam or a galvanometer system.

The non-coherent light source used to initiate the light activated colour change reaction can be a lamp, bulb, light-emitting diode or an array of light-emitting diodes.

The light can be monochromatic or broadband. Lasers are particularly useful for producing monochromatic light and non-coherent light sources are particularly useful for producing broadband light.

Preferred light has in the wavelength range 200 nm to 20 microns.

Lasers are particularly useful for initiating the light activated colour change in precise regions of the substrate via a computer controlled imaging system to give rise to high resolution images. Lasers are also particularly preferred for producing very small images or micro-imaging. Lasers can also be used to high speed imaging processes.

Non-coherent light can be used for initiating the colour change reaction in a specific region of the substrate when used in combination with a mask.

Colour Change Chemistry

Any diacetylene or combination of diacetylene and other substances capable of undergoing a colour change reaction upon exposure to light may be used in the present invention.

Diacetylene compounds are substances which include at least one diacetylene group, i.e. —C≡C—C≡C—. Particularly preferred are diacetylene compounds that exhibit a polychromic colour change reaction. These compounds are initially colourless but on exposure to suitable light, such as a ultra-violet light, undergo a colour change reaction to produce a blue colour. Certain diacetylenes in their blue form can then be exposed to further light such as near-infrared light, which converts the blue form into a magenta, red, yellow and green form.

Specific examples of diacetylene compounds may be used in the present invention are given in the published patent application number WO2006/018640.

Further examples include those represented by the following general structures:

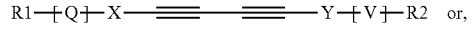

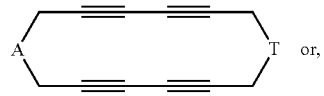

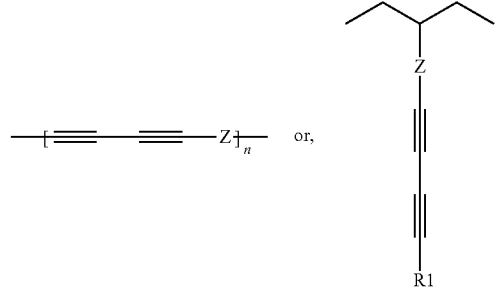

wherein,

X and Y are divalent straight-chain or branched alkylene type groups (—CH$_2$—)$_n$ wherein n=0 to 24, or a divalent phenylene type group (—C$_6$H$_4$—)$_n$ wherein n=0 to 1 or a combination of both types;

Q and V, if present, are divalent bridging groups such as —S—, —O—, —NHR'— wherein R' is hydrogen or alkyl, amide, ester or thioester groups, carbonyl or carbamate;

R1 and R2 are H or alkyl;

A and T are divalent groups that can either be an alkylene or phenylene type such as X or Y, or a bridging type such as Q or V, or a combination of both types, X or Y that additionally comprises a Q or V group;

Z is a divalent group such as X or Q or a combination of both, X that additionally comprises a Q group, or Z can be not present, and n is 2 to 20,000,000.

Groups X and Y are optionally substituted, preferably at the α, β or γ position with respect to the diacetylene group. For instance, there may be an α-hydroxy group, as shown in the formula below:

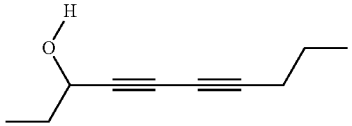

The diacetylene may be symmetrical or non-symmetrical.

Q and V are optionally substituted with groups such as amine, alcohol, thiol or carboxylic acid. Both Q and V may be present, or alternatively, just Q.

Where R1 and R2 in the above compounds are alkyl, they may be straight or branched chain and may additionally comprise other functional groups known in organic chemistry such as alcohol, amine, carboxylic acid, aromatic ring systems and unsaturated groups such as alkenes and alkynes.

Groups R1, R2, Q, V, X and Y may comprise ionic groups, which can be anionic or cationic. Examples include sulphate groups (—SO$_3$—) and ammonium groups. The ionic groups can have any suitable counterion.

Further diacetylene compound examples are diacetylene carboxylic acids and derivatives thereof. A particularly preferred diacetylene carboxylic acid compounds are 10,12-pentacosadiynoic acid and 10,12-docosadiyndioic acid and their derivatives thereof. Further examples include: 5,7-dodecadiyndioic acid, 4,6-dodecadiynoic acid, 5,7-eicosadiynoic acid, 6,8-heneicosadiynoic acid, 8,10-heneicosadiynoic acid, 10,12-heneicosadiynoic acid, 10,12-heptacosadiynoic acid, 12,14-heptacosadiynoic acid, 2,4-heptadecadiynoic acid, 4,6-heptadecadiynoic acid, 5,7-hexadecadiynoic acid, 6,8-nonadecadiynoic acid, 5,7-octadecadiynoic acid, 10,12-octadecadiynoic acid, 12,14-pentacosadiynoic acid, 2,4-pentadecadiynoic acid, 5,7-tetradecadiynoic acid, 10,12-tricosadiynoic acid 2,4-tricosadiynoic acid, and derivatives thereof. Diacetylene alcohols and diol compounds and derivatives thereof are also preferred, examples include: 5,7-dodecadiyn-1,12-diol, 5,7-eicosadiyn-1-ol, 2,4-heptadecadiyn-1-ol, 2,4-hexadiyn-1,6-diol, 3,5-octadiyn-1,8-diol, 4,6-decadiyn-1,10-diol, 2,7-dimethyl-3,5-octadiyn-2,7-diol, 14-hydroxy-10,12-tetradecadiynoic acid. Others include 1,6-diphenoxy-2,4-hexadiyne, 1,4-diphenylbutadiyne, 1,3-heptadiyne, 1,3-hexadiyne and 2,4-hexadiyne.

A combination of different diacetylenes can also be employed. A particularly preferred combination is that of 10,12-pentacosadiynoic acid or 10,12-docosadiyndioiac acid and derivatives thereof and 2,4-hexadiyn-1,6-diol. 10,12-pentacosadiynoic acid can produce blue, red and yellow. 2,4-hexadiyn-1,6-diol can produce a cyan colour. Activating 10,12-pentacosadiynoic acid to yellow and 2,4-hexadiyn-1,6-diol to cyan simultaneously gives rise to green.

A diacetylene compound that is 'activatable', i.e. has a first solid form that is relatively unreactive to light, but upon 'activation' is transformed into a second form that is relatively reactive to light and is thus capable of undergoing a colour change reaction to create a visible image, has particular utility in the present invention. Without being limited by theory the activation could be a re-crystallisation, crystal form modification, co-crystal combination or a melting/re-solidification process.

Particularly preferred diacetylenes are those that after initial melting and re-solidification activation are colourless but become blue on exposure to light, particularly UV light. The most preferred diacetylenes compounds are carboxylic acids and derivatives thereof where:

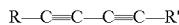

either R and/or R' comprises a COX group, where X is: —NHY, —OY, —SY, where Y is H or any group comprising at least one carbon atom.

Particularly preferred still are derivatives in which the carboxylic acid group has been functionalised into an amide, ester or thioester. These can be easily made by reacting a diacetylene carboxylic acid with a chlorinating agent such as oxalyl chloride and then reacting the diacetylene acid chloride with a nucleophilic compound such as an amine, alcohol or thiol. A particularly preferred diacetylene carboxylic acid compound is 10,12-docosadiyndioic acid and derivatives thereof such as amides, esters, thioesters and the like. Especially particularly preferred 10,12-docosadiyndioic acid derivatives are amides. A particularly preferred still 10,12-docosadiyndioic acid amide derivative is the propargylamide in which at least one, preferably both carboxylic acid groups have been transformed into the propargylamide, as shown below:

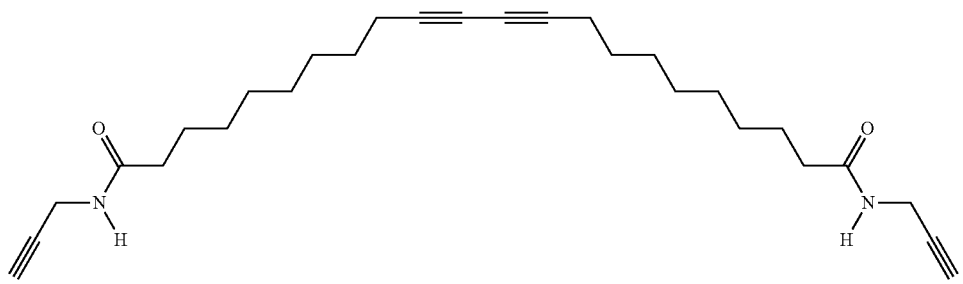 [SMILES: C#CCNC(=O)CCCCCCCCC#CC#CCCCCCCCCC(=O)NCC#C]

Propargylamides are made by reacting carboxylic acids with propargylamine. Other preferred amines that can be used to create suitable amides include: dipropargylamine and 1,1-dimethylpropargylamine.

The activatable diacetylene is generally used together with a NIR light absorbing agent, which is a compound that absorbs light in the wavelength range 700 to 2500 nm.

A NIR light source, such as a NIR fibre laser, is used to heat the coating only in the areas where the image is required. A UV light source, such as a germicidal lamp, is then used to flood the coating with UV light. However, the diacetylene compound only undergoes a colour change reaction to create an image in the areas which were initially exposed to NIR light. The areas of the coating unexposed to NIR light undergo a negligible colour change reaction, remain essentially colourless, and are stable to background radiation. A thermal print head may be used to initiate the heat-based pre-activation step.

Specific examples of NIR light absorbing agents include:
i. Organic NIR absorbing agents
ii. NIR absorbing 'conductive' polymers
iii. Inorganic NIR absorbing agents
iv. Non-stoichiometric inorganic absorbing agents.

Particularly preferred NIR absorbing agents are those that have essentially no absorbance in the visible region of the spectrum (400 to 700 nm) and thus give rise to coatings that appear visibly colourless.

Organic NIR absorbing agents are known as NIR dyes/pigments. Examples include but are not limited to: families of metallo-porphyrins, metallo-thiolenes and polythiolenes, metallo-phthalocyanines, aza-variants of these, annellated variants of these, pyrylium salts, squaryliums, croconiums, amminiums, diimoniums, cyanines and indolenine cyanines.

Examples of organic compounds that can be used in the present invention are taught in U.S. Pat. No. 6,911,262, and are given in Developments in the Chemistry and Technology of Organic dyes, J Griffiths (ed), Oxford: Blackwell Scientific, 1984, and Infrared Absorbing Dyes, M Matsuoka (ed), New York: Plenum Press, 1990. Further examples of the NIR dyes or pigments of the present invention can be found in the Epolight™ series supplied by Epolin, Newark, N.J., USA; the ADS series supplied by American Dye Source Inc, Quebec, Canada; the SDA and SDB series supplied by HW Sands, Jupiter, Fla., USA; the Lumogen™ series supplied by BASF, Germany, particularly Lumogen™ IR765 and IR788; and the Pro-Jet™ series of dyes supplied by FujiFilm Imaging Colorants, Blackley, Manchester, UK, particularly Pro-Jet™ 830NP, 900NP, 825LDI and 830LDI. Further examples are taught in WO08/050153.

Examples of NIR absorbing 'conductive' polymers include PEDOT such as, the product Baytron® P supplied by HC Starck. Further examples are taught in WO05/12442.

Examples of inorganic NIR absorbing agents include copper (II) salts. Copper (II) hydroxyl phosphate (CHP) is particularly preferred. Further examples are taught in WO05/068207.

Examples of non-stoichiometric inorganic absorbing agents include reduced indium tin oxide, reduced antimony tin oxide and reduced titanium nitrate. Further examples are taught in WO05/095516. Reduced indium tin oxide is particularly preferred in combination with a 1550 nm to 2500 nm laser.

It is particularly preferred if the absorption profile of the NIR absorbing agent approximately matches the emission wavelength(s) of the NIR light source employed.

Other light absorbing agents that can be used, instead of the NIR absorbing agent include UV (200 to 400 nm), visible (400 to 700 nm) and mid-infrared (~10.6 microns) light absorbing agents. Examples includes dyes/pigments, UV absorbers and Iriodin type agents.

Charge transfer agents may be used together with a diacetylene in the present invention. These are substances that are initially colourless but react with protons ($H^+$) to produce a coloured form. Charge transfer agents that form part of the present invention include compounds known as carbazoles and suitable examples are described in WO2006/051309. Further charge transfer agents known to those skilled in the art such as leuco dyes can also be used. Charge transfer agents are usually used in combination with other substances such as light absorbing agents which can be wavelength specific, heat generating agents, acid generating agents and the like.

A particularly preferred combination for use in this invention is a diacetylene such as 10,12-pentacosaidiynoic acid, or 10,12-docosadiyndioic acid (or a derivative thereof), to give blue and red, with a charge transfer agent that generates green.

Application of Colour Change Chemistries

The light activated compounds can be applied to be substrate in the form of a coating on the surface of the substrate. This is usually performed by formulating the light activated compound into an ink formulation and then coating the ink onto the surface of the substrate. Any coating or ink application technique could be employed. The coating can be applied to the entire surface of the substrate or just specific areas. The ink formulation can also comprise other substances such as binders, solvents and the like. The light activated compounds can also be applied to the substrate within the bulk of the substrate. Where the substrate is a thermoplastic film the light activated compounds can be co-moulded or co-extruded into the thermoplastic used to produce the film.

The substrate can be any opaque or transparent material used to make a colour filter depending upon the application. Glass and thermoplastic films are particularly preferred.

Use of Colour Filters

The colour filters of the present invention can be used as traditional colour filters in for example stage lighting, special effects, optical recording devices, photography, astronomy and microscopy.

However, the present invention is particularly advantageous for the production of colour filters for use in liquid crystal displays (LCDs). LCDs are usually manufactured using photolithography or ink-jet printing techniques. The light activated substances of the present invention can be used to produce highly transparent colours required for LCDs. Also the current invention is much simpler than the state of the art and gives rise to high throughputs. The LCD displays comprising colour filters of the present invention can be used in the manufacture of devices such as televisions, lap top computers, mobile phones or any device requiring an LCD display. The colour filters of the present invention can also be used to make plasma screen and electrophoretic displays.

The colour filters of the present invention can also be used in the manufacture of colour filter arrays, an example of which is the Bayer Array as used in sensors, cameras, video cameras, and scanners. Other colour filter applications of the present invention include: Panchromatic cells, Foveon's vertical color filter and the Kodak Color Filter Array 2.0.

The following Examples illustrate the invention.

EXAMPLE 1 a. Carbazole Ink

N-Ethyl carbazole (ex. Aldrich, 5 g) was dissolved in a 15% solution of nitrocellulose DLX3-5 (ex. Nobel Enterprises) in MEK (95 g).

Copper (II) triflate (ex. Aldrich, 0.38 g) was then dissolved in the above N-ethyl carbazole/NC solution (9.62 g).

b. Diacetylene Ink 10,12-Pentacosadiynoic acid (ex. GFS Chemicals, 0.5 g) was dissolved in ethyl acetate (2 g). This solution was then added to Durotak 180-1197 adhesive (ex. Delft National Chemie, Zutphen, Netherlands) and was warmed with shaking into a clear solution.

Ink Application

The carbazole ink was coated onto 50 micron clear PET film using a 30 micron K-bar and RK-Proofer Printer and dried.

The diacetylene/Durotak ink was coated onto 50 micron clear biaxially orientated polypropylene using a 30 micron K-bar and RK-Proofer Printer and dried.

The two coated substrates were pressed together to form a laminate construction.

A broadband UV germicidal lamp was used to initiate the diacetylene colourless to blue colour change reaction through the polypropylene film layer of the laminate. The polyacetylene blue colour was then turned into red by the application of heat using a hot air gun.

Contact heat applied using a heat sealer operating at 130° C. was then employed to turn the colourless laminate green by activating the carbazole colourless to green colour change reaction.

|  | L* | a* | b* |
|---|---|---|---|
| Blue colour | 20.05 | 9.24 | −33.14 |
| Red colour | 52.66 | 57.03 | 45.30 |
| Green colour | 58.34 | −20.61 | 45.40 |

L* = Lightness (0 to 100)
a* = +ve Redness to −ve Greeness
b* = +ve Yellowness to −ve Blueness The L*, a* and b* colour coordinates displayed in the above table clearly show that three visually distinct hues, namely blue, red and green can be obtained using the present invention. Consequently the colour filter of the present invention can therefore generate all possible colours by additively mixing combinations of these.

The resultant trichromatic laminate construction was useful in the production of colour filters.

EXAMPLE 2

Single ink a. Carbazole Part

N-Ethyl carbazole (ex. Aldrich, 1 g) was dissolved in a 15% solution of nitrocellulose DLX3-5 (ex. Nobel Enterprises) in MEK (9 g).

Copper (II) triflate (ex. Aldrich, 0.72 g) was then dissolved in the above N-ethyl carbazole/NC solution (9.38 g).

b. Diacetylene Part 10,12-Pentacosadiynoic acid (ex. GFS Chemicals, 1 g) was dissolved in a 15% solution of Elvacite 2028 in ethyl acetate (9.0 g).

The carbazole ink (5 g) and the diacetylene ink (5 g) were then combined to form a single ink.

Ink Application

The single ink was coated onto clear 50 micron biaxially orientated polypropylene film using a 30 micron K-bar and RK Proofer Printer.

Durotak 180-1197 adhesive (ex. Delft National Chemie, Zutphen, Netherlands, 7.5 g) was dissolved in ethyl acetate 2.5 g.

The Durotak was coated onto clear 50 micron PET film using a 30 micron K-bar and RK Proofer Printer.

The two films were combined to produce a laminate construction.

A broadband UV germicidal lamp was used to initiate the diacetylene colourless to blue colour change reaction. The polyacetylene blue colour was then turned into red by the application of heat using a hot air gun.

Contact heat applied using a heat sealer operating at 130° C. was then employed to turn the colourless laminate green by activating the carbazole colourless to green colour change reaction.

|  | L | a | b |
|---|---|---|---|
| Blue colour | 19.05 | 9.64 | −33.34 |
| Red colour | 58.66 | 54.03 | 46.30 |
| Green colour | 65.34 | −15.61 | 35.40 |

The L*, a* and b* colour coordinates displayed in the above table clearly show that three visually distinct hues, namely blue, red and green can be obtained using the present invention. Consequently the colour filter of the present invention can therefore generate all possible colours by additively mixing combinations of these.

The resultant trichromatic laminate construction was useful in the production of colour filters.

EXAMPLE 3 a. Diacetylene Ink 10,12-Pentacosadiynoic acid (1 g), Durotak 180-1197 (19 g) and ethyl acetate (4 g) were mixed together to produce an ink solution.

The ink was coated onto clear 50 micron biaxially orientated polypropylene film using a 30 micron K-bar and RK Proofer Printer.

b. Leuco Dye Ink

An ink was formulated comprising: Pergascript Blue SRB-P (ex. Ciba, 1.7 g), Yamada Yellow Y-726 (ex. Yamada 2.8 g), Tinuvin 770DF (0.6 g), Sericol Polyplast PY-383 (ex. Sericol, 56 g), Sericol Thinner ZV-557 (ex. Sericol 35.5 g) and Cyracure UVI Photoinitiator UVI-6992 (ex. Dow, 3.4 g).

The ink was coated onto clear 50 micron biaxially orientated polypropylene film using a 30 micron K-bar and RK Proofer Printer.

The two coated BOPP films were combined to form a laminate.

The diacetylene layer turned colourless to blue and then red on exposure to UV light emitted from a Coherent Avia 266 nm UV laser or a suitable broadband light source, which includes 266 nm radiation, such as that provided by a Jenton Acticure 4000.

The leuco dye layer turned colourless to green on exposure to UV light such as that emitted from the Coherent Avia 355 nm UV laser or a suitable >355 nm light source, or for example a broadband UV source which includes 355 nm radiation such as a Jenton Acticure 4000 but using an appropriate band pass filter which allowed only the transmission of light above 355 nm.

CIE L*a*b* Colours produced were—

| Red   | L* | 47.82 | a* | 42.95  | b* | 65.79 |
|-------|----|-------|----|--------|----|-------|
|       |    | 37.92 |    | 49.20  |    | 56.70 |
| Green | L* | 60.68 | a* | −14.33 | b* | 65.30 |
|       |    | 52.94 |    | −8.08  |    | 51.32 |
| Blue  | L* | 53.87 | a* | −27.00 | b* | −5.67 |
|       |    | 20.10 |    | −5.47  |    | 26.68 |

(Measured with Gretag Macbeth Spectroeye)

The L*, a* and b* colour coordinates displayed in the above table clearly show that three visually distinct hues, namely blue, red and green can be obtained using the present invention. Consequently the colour filter of the present invention can therefore generate all possible colours by additively mixing combinations of these.

The diacetylene layer will not change colour if exposed to wavelengths above approximately 310 nm. This technique allows the green colour change to be initiated independently of the blue red colour change which is vital for the production of pure colours.

Alternatively the blue and red colour can be achieved from the diacetylene side of the laminate construction and the green from the reverse (leuco dye) side.

EXAMPLE 4 a. Diacetylene Ink 10,12-Docosadiyndioic propargyldiamide (1 g), made by reacting 10,12-docosadiyndioic acid via its acid chloride with propargylamine, Durotak 180-1197 (19 g), N,N,N,N-tetrakis (4-dibutylaminophenyl)-p-benzoquinone (0.1 g) and acetone (4 g) were mixed together to produce an ink solution.

The ink was coated onto clear 50 micron biaxially orientated polypropylene film using a 30 micron K-bar and RK Proofer Printer.

b. Leuco Dye Ink

An ink was formulated comprising: Pergascript Blue SRB-P (ex. Ciba, 1.7 g), Yamada Yellow Y-726 (ex. Yamada 2.8 g), Tinuvin 770DF (0.6 g), Sericol Polyplast PY-383 (ex. Sericol, 56 g), Sericol Thinner ZV-557 (ex. Sericol 35.5 g) and Cyracure UVI Photoinitiator UVI-6992 (ex. Dow, 3.4 g).

The ink was coated onto clear 50 micron biaxially orientated polypropylene film using a 30 micron K-bar and RK Proofer Printer.

The two coated BOPP films were combined to form a laminate.

The diacetylene layer was unreactive unless pre-activated using a NIR fibre laser operating with a wavelength of 1070 nm and then exposed to UV light such as that emitted from a Coherent Avia 266 nm UV laser or a suitable broadband light source, which includes 266 nm radiation, such as that provided by a Jenton Acticure 4000. Only in the areas that had been pre-activated with NIR light did a colourless to blue colour change reaction take place. The non-NIR exposed regions remained colourless on exposure to UV light.

The leuco dye layer turned colourless to green on exposure to UV light such as that emitted from the Coherent Avia 355 nm UV laser or a suitable >355 nm light source, or for example a broadband UV source which includes 355 nm radiation such as a Jenton Acticure 4000 but using an appropriate band pass filter which allowed only the transmission of light above 355 nm.

EXAMPLE 5

Mixed Diacetylene Ink 10,12-Pentacosadiynoic acid (1 g), 1,6-diol-2,4-hexadiyne (1 g), Durotak 180-1197 (19 g) and ethyl acetate (4 g) were mixed together to produce an ink solution.

The ink was coated onto clear 50 micron biaxially orientated polypropylene film using a 30 micron K-bar and RK Proofer Printer.

The ink was then laminated with another piece of BOPP.

A low power UV laser was used to create blue and red colours. Irradiating the blue areas with a higher fluence UV light initiated the yellow forming 1,6-diol-2,4-hexadiyne to give a green colour.

The invention claimed is:

1. A method for producing a colour filter, comprising: applying to a substrate at least one diacetylene capable of undergoing a light-activated colour change reaction, and exposing an area of the substrate to light thereby causing the exposed area of the substrate to change colour.

2. The method as described in claim 1, wherein the colour change reaction is from colourless to coloured.

3. The method as described in claim 1, wherein the light is laser light.

4. The method as described in claim 3, wherein the laser light has a wavelength in the region 200 nm to 20 μm.

5. The method as described in claim 4, wherein the laser is a steered beam laser system, a diode laser, a diode array laser, or a fiber laser.

6. The method as described in claim 1, wherein the light is noncoherent light.

7. The method as described in claim 6, wherein the noncoherent light is provided by a lamp, bulb, light-emitting diode, or array of light-emitting diodes.

8. The method according to claim 1, wherein the diacetylene is applied to the substrate together with a charge transfer agent.

9. The method according to claim 8, wherein the charge transfer agent is a leuco dye or a carbazole.

10. The method according to claim 1, wherein the diacetylene is 10,12-docosadiyndioic acid or a derivative thereof.

11. The method according to claim 1, wherein the diacetylene is applied to the substrate together with a light absorbing agent and the diacetylene is initially unreactive but becomes reactive upon activation.

12. The method as described in claim 1, wherein the diacetylene is coated onto the surface of the substrate.

13. The method as described in claim 1, wherein the diacetylene is incorporated into the substrate.

14. A device comprising a colour filter produced by the method of claim 1.

15. The device according to claim 14, that is a display device.

16. The device, according to claim 15, that is a liquid crystal display.

17. The method, according to claim 1, wherein the diacetylene is 10,12-docosadiyndioic mono or dipropargylamide.

18. A colour filter produced by the method of claim 1.

* * * * *